United States Patent
Pedersen et al.

(10) Patent No.: US 12,255,438 B2
(45) Date of Patent: *Mar. 18, 2025

(54) LASER DEVICE

(71) Applicant: NKT PHOTONICS A/S, Birkerød (DK)

(72) Inventors: Jens E. Pedersen, Birkerød (DK); Poul Varming, Copenhagen (DK); Christian V. Poulsen, Lynge (DK); Thomas O. Fagerhøj, Roskilde (DK); Bjarke Gøth, Roskilde (DK); Henrik Sørensen, Farum (DK)

(73) Assignee: NKT PHOTONICS A/S, Birkerød (DK)

( * ) Notice: Subject to any disclaimer, the term of this patent is extended or adjusted under 35 U.S.C. 154(b) by 0 days.

This patent is subject to a terminal disclaimer.

(21) Appl. No.: 18/326,298

(22) Filed: May 31, 2023

(65) Prior Publication Data

US 2024/0106198 A1 Mar. 28, 2024

Related U.S. Application Data

(63) Continuation of application No. 17/479,373, filed on Sep. 20, 2021, now Pat. No. 11,699,891, which is a (Continued)

(30) Foreign Application Priority Data

Feb. 10, 2012 (DK) .......................... PA 2012 00109

(51) Int. Cl.
*H01S 5/0687* (2006.01)
*G01B 9/02001* (2022.01)
(Continued)

(52) U.S. Cl.
CPC ........ *H01S 5/0687* (2013.01); *G01B 9/02001* (2013.01); *H01S 3/2391* (2013.01);
(Continued)

(58) Field of Classification Search
CPC ............. G01B 9/02001; H01S 2301/02; H01S 3/2391; H01S 5/02251; H01S 5/0654; H01S 5/0687; H01S 5/141; H01S 5/4087
See application file for complete search history.

(56) References Cited

U.S. PATENT DOCUMENTS

| 4,150,342 A | 4/1979 | Johnston et al. |
| 4,583,228 A | 4/1986 | Brown et al. |

(Continued)

FOREIGN PATENT DOCUMENTS

| DE | 19827699 A1 | 12/1999 |
| EP | 1191650 A1 | 3/2002 |

(Continued)

OTHER PUBLICATIONS

Office Action (Communication pursuant to Article 94(3) EPC) issued on Sep. 9, 2022, by the European Patent Office in corresponding European Application No. 13 746 082.0-1212. (6 pages).

(Continued)

*Primary Examiner* — Hina F Ayub
(74) *Attorney, Agent, or Firm* — Boone IP Law

(57) ABSTRACT

A laser device includes a laser configured to generate laser light and a laser control module configured to receive at least a portion of the laser light generated by the laser, to generate a control signal and to feed the control signal back to the laser for stabilizing the frequency, wherein the laser control module includes a tunable frequency discriminating element which is preferably continuously frequency tunable, and where the laser control module is placed outside the laser cavity.

18 Claims, 6 Drawing Sheets

Related U.S. Application Data continuation of application No. 16/421,645, filed on May 24, 2019, now Pat. No. 11,152,761, which is a continuation of application No. 15/602,432, filed on May 23, 2017, now Pat. No. 10,340,657, which is a continuation of application No. 14/377,570, filed as application No. PCT/DK2013/050036 on Feb. 8, 2013, now Pat. No. 9,667,033.

(51) Int. Cl.
| | |
|---|---|
| *H01S 3/23* | (2006.01) |
| *H01S 5/02251* | (2021.01) |
| *H01S 5/065* | (2006.01) |
| *H01S 5/14* | (2006.01) |
| *H01S 5/40* | (2006.01) |

(52) U.S. Cl.
CPC ........ *H01S 5/02251* (2021.01); *H01S 5/0654* (2013.01); *H01S 5/141* (2013.01); *H01S 5/4087* (2013.01); *H01S 2301/02* (2013.01)

(56) References Cited

U.S. PATENT DOCUMENTS

| | | |
|---|---|---|
| 5,452,118 A | 9/1995 | Maruska |
| 5,956,355 A | 9/1999 | Swanson et al. |
| 6,233,263 B1 | 5/2001 | Chang-hasnain et al. |
| 6,400,739 B1 | 6/2002 | Auracher |
| 6,422,766 B1 | 7/2002 | Althaus et al. |
| 6,430,207 B1 | 8/2002 | Alphonse |
| 6,567,433 B2 | 5/2003 | May |
| 6,587,484 B1 | 7/2003 | May |
| 6,611,341 B2 | 8/2003 | May |
| 6,671,296 B2 | 12/2003 | May |
| 6,690,693 B1 | 2/2004 | Crowder |
| 6,693,928 B2 | 2/2004 | May |
| 6,714,309 B2 | 3/2004 | May |
| 6,965,622 B1 | 11/2005 | Cho et al. |
| 7,027,470 B2 | 4/2006 | May |
| 7,221,429 B1 | 5/2007 | Cavanaugh et al. |
| 7,460,567 B2 | 12/2008 | May |
| 7,466,726 B2 | 12/2008 | Liu |
| 7,697,579 B1 | 4/2010 | Delfyett et al. |
| 7,720,117 B2 | 5/2010 | Liu |
| 7,833,463 B1 | 11/2010 | Munson et al. |
| 9,667,033 B2 | 5/2017 | Pedersen et al. |
| 10,340,657 B2 * | 7/2019 | Pedersen ............... H01S 5/0654 |
| 11,152,761 B2 * | 10/2021 | Pedersen ............... H01S 3/2391 |
| 11,699,891 B2 * | 7/2023 | Pedersen ............ G01B 9/02001 356/519 |
| 2002/0018627 A1 | 2/2002 | Kato et al. |
| 2002/0041611 A1 | 4/2002 | May |
| 2002/0043616 A1 | 4/2002 | May |
| 2002/0044575 A1 | 4/2002 | May |
| 2002/0054734 A1 | 5/2002 | Masuda et al. |
| 2002/0097760 A1 | 7/2002 | May |
| 2002/0163650 A1 | 11/2002 | May |
| 2002/0163942 A1 | 11/2002 | Baillargeon et al. |
| 2002/0172239 A1 | 11/2002 | Mcdonald et al. |
| 2002/0180978 A1 | 12/2002 | Berg et al. |
| 2004/0066810 A1 | 4/2004 | May |
| 2004/0101016 A1 | 5/2004 | Mcdonald et al. |
| 2004/0125830 A1 | 7/2004 | Koller et al. |
| 2005/0069013 A1 | 3/2005 | Castillega et al. |
| 2005/0078716 A1 | 4/2005 | Liu |
| 2006/0159135 A1 | 7/2006 | Cliche et al. |
| 2006/0182157 A1 | 8/2006 | Bollenz et al. |
| 2006/0268948 A1 | 11/2006 | May |
| 2006/0290944 A1 | 12/2006 | Arnott et al. |
| 2008/0057773 A1 | 3/2008 | Ingenbleek et al. |
| 2008/0158568 A1 | 7/2008 | Claydon et al. |
| 2009/0041066 A1 | 2/2009 | Liu |
| 2009/0257460 A1 | 10/2009 | Mizutani et al. |
| 2010/0067843 A1 | 3/2010 | Little |
| 2010/0211333 A1 | 8/2010 | Pruet et al. |
| 2010/0265973 A1 | 10/2010 | Copner et al. |
| 2010/0296812 A1 | 11/2010 | Asghari |
| 2010/0298897 A1 | 11/2010 | Chavan et al. |
| 2010/0303121 A1 | 12/2010 | Stolpner et al. |
| 2011/0109909 A1 | 5/2011 | Wu |
| 2012/0051375 A1 | 3/2012 | Karpushko |
| 2012/0099611 A1 | 4/2012 | Kim et al. |
| 2012/0195553 A1 | 8/2012 | Hasegawa et al. |
| 2012/0294321 A1 | 11/2012 | Ma et al. |
| 2016/0315440 A1 * | 10/2016 | Han ................. H01S 3/094065 |
| 2019/0334314 A1 | 10/2019 | Pedersen et al. |
| 2022/0006261 A1 | 1/2022 | Pedersen et al. |

FOREIGN PATENT DOCUMENTS

| | | |
|---|---|---|
| GB | 2109122 A | 5/1983 |
| WO | 02063248 A2 | 8/2002 |
| WO | 03005502 A2 | 1/2003 |

OTHER PUBLICATIONS

Danish Search Report dated Jan. 9, 2013.
Extended European Search Report issued Sep. 24, 2015 in European Patent Application No. 137 46082.0-1556 / 2812960 and English translation thereof.
Greverie et al., "Stabilisation en Frequence d'un Laser Fibre par Controle du Courant de Pompe", JNOG 2008 Conference, Lannion, France, Ma2.3, 3 pages.
Jan Hald et al., "Fiber Laser Optical Frequency Standard at 1.54 µm", Optics Express, vol. 19, Issue 3, pp. 2052-2063, Jan. 31, 2011.
Van Leeuwen et al., "Low Noise High Power Solid State Laser for 1550 NM Wavelength Band", Princeton Optonics, 1 Electronics Drive, Mercerville, NJ 08619, Proceedings of the 19th annual meeting of the IEEE Lasers and Electro-Optics Society (LEOS '06), pp. 336-337, 2006.
Written Opinion (PCT/ISA/237) mailed on Apr. 11, 2013, by the Danish Patent Office as the International Searching Authority for International Application No. PCT/DK2013/050036.
International Search Report (PCT/ISA/210) mailed on Apr. 11, 2013, by the Danish Patent Office as the International Searching Authority for International Application No. PCT/DK2013/050036.
Trobs et al., "Frequency Stabilization and Actuator Characterization of an Ytterbium-Doped Distributed-Feedback Fiber Laser for Lisa", J_ Opt. Soc. Am. B, vol. 26, No. 5, May 2009.
Tuominen et al., "Wavelength Reference for Optical Telecommunications Based on a Temperature-Tunable Silicon Etalon", Review of Scientific Instruments, vol. 74, No. 8, Aug. 2003.
Examination Report mailed on Jul. 29, 2024, by the European Patent Office for European Application No. 13746082.0, 8 pages.

* cited by examiner

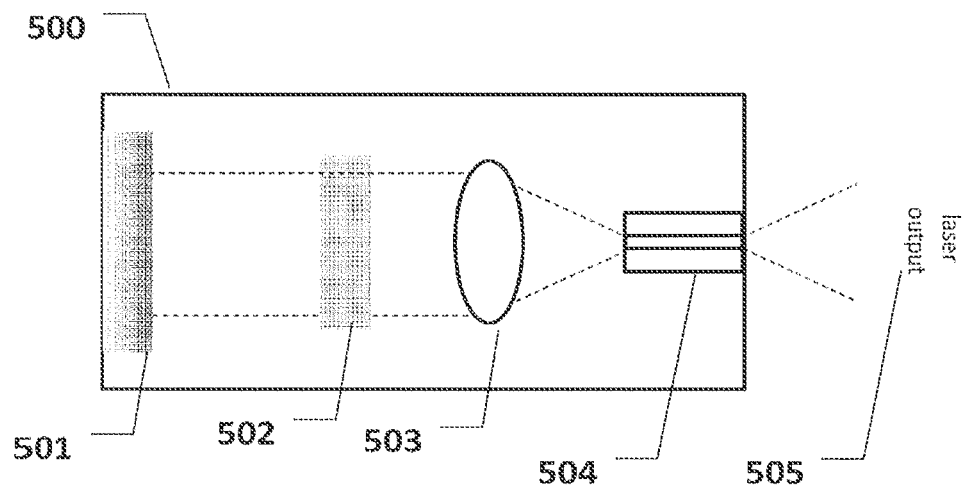
Fig.5: Prior art
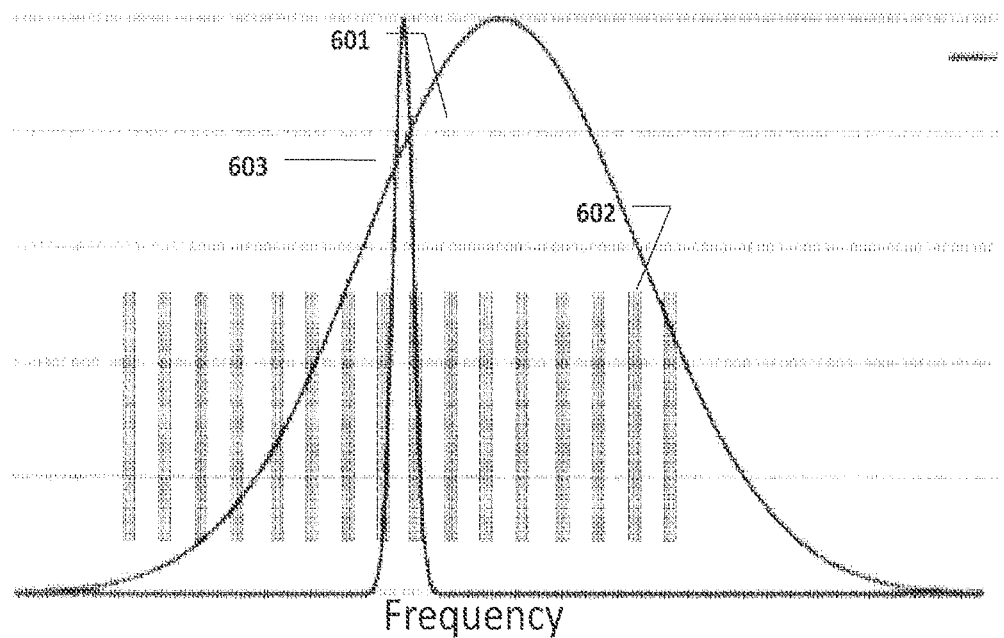
Fig.6: Prior art

LASER DEVICE

CROSS-REFERENCE TO RELATED APPLICATIONS

The present application is a continuation of U.S. application Ser. No. 17/479,373, filed on Sep. 20, 2021, which is a continuation of U.S. application Ser. No. 16/421,645, filed on May 24, 2019, now U.S. Pat. No. 11,152,761, which is a continuation of U.S. application Ser. No. 15/602,432, filed on May 23, 2017, now U.S. Pat. No. 10,340,657, which is a continuation of U.S. application Ser. No. 14/377,570, filed on Aug. 8, 2014, now U.S. Pat. No. 9,667,033, which is a US national stage application of International Application No. PCT/DK2013/050036, filed on Feb. 8, 2013, and claims the benefit of Danish Patent Application No. PA 2012 00109, filed on Feb. 10, 2012. The entire contents of each of U.S. application Ser. No. 17/479,373, U.S. application Ser. No. 16/421,645, U.S. application Ser. No. 15/602,432, U.S. application Ser. No. 14/377,570, International Application No. PCT/DK2013/050036, and Danish Patent Application No. PA 2012 00109 are hereby incorporated herein by reference in their entirety.

TECHNICAL FIELD

This application relates to a laser device exhibiting low levels of frequency noise and to application of such laser devices for example in interferometric sensing.

BACKGROUND ART

Single frequency fiber lasers are commonly known to produce laser light with a very high degree of frequency stability and a corresponding very low level of frequency noise. This has made this class of lasers particularly suited for a number of applications within interferometric and remote sensing where the frequency noise of the laser light is a limiting factor. Development within especially the field of geo-seismic sensing has called for even lower levels of frequency noise than are typically obtained from standard, non-conditioned fiber lasers. Some of these applications further require that the lasers can be tuned while at the same time they must exhibit very low frequency noise. It is known from numerous publications within the field of laser based spectroscopy, and especially from the field of laser trapping and cooling that frequency locking of the laser frequency to stable interferometers with high finesse can lead to significant reductions in laser frequency noise (prior art examples include [Tröbs et al], [Gréverie et al]). Laser frequency locking in the prior art is typically obtained using large size interferometers which are un-suited for integration with compact laser systems devised for field applications. On the other hand, compact, hermetically packaged, and fiber coupled interferometers for laser wavelength locking are well known from the field of optical telecommunications, where so-called wavelength lockers are used to maintain the laser frequency within a typical filter bandwidth e.g. in a dense wavelength division multiplexed optical communication system. Such telecom grade wavelength lockers are un-suited for the purpose of laser frequency noise reduction due to their low coefficient of finesse (also simply called low finesse), and further they cannot be tuned in wavelength or frequency. The prior art describes a frequency tunable telecom grade wavelength locker ([Tuominen et al]). However, this wavelength locker again has a very low finesse and is hence unsuited for laser frequency noise reduction.

The prior art further describes a frequency tunable external cavity diode laser incorporating thermally tunable etalons e.g. as in US2004/0101016 A1. It is well known in the art that extending the cavity length of e.g. diode lasers leads to a reduction in linewidth and similarly in the fundamental phase noise as defined by the Shawlow-Townes limit. This is typically obtained by coupling the output of the diode laser to an external cavity comprising an output coupler and a high reflectivity mirror. However, when extending the cavity length, the cavity free spectral range is reduced, and spectral filtering elements are typically needed to ensure single mode operation. These spectral filtering elements (or mode filters) are placed inside the extended cavity, such as is the case for the tunable etalons described in US2004/0101016 A1. In this document, the thermal tunability of the etalons secures frequency tunability of the external cavity laser by effectively changing the optical path length of the cavity. However, while the etalon in this manner assists in obtaining single mode operation, its potential insensitivity to technical noise (such as can be obtained via a compact etalon design and hermetic sealing) is not utilized.

WO 03/005502 A2 discloses a similar example where a thermally tunable etalon is placed inside the laser and is likewise used to tune the wavelength of an external cavity diode laser.

SUMMARY

The present disclosure aims to provide laser devices and techniques to alleviate at least some of the problems described above and preferably, the disclosure aims at improving the frequency noise of frequency tunable compact laser devices.

It is an object of the disclosure to provide a laser device that generates laser light and that comprises a tunable laser and a tunable laser control module that acts to stabilize the frequency of the laser and provide a high frequency stability of the laser light, and at the same time maintain frequency tunability of the device.

It is further an object of the disclosure to provide a laser device (herein also referred to as a frequency stable laser device) which is compact and robust against environmental impact such as vibration and/or ambient temperature changes.

In an embodiment of the disclosure, it is further an object to provide a frequency stable tunable laser device which is suitable for application in interferometric sensing systems, such as are used in geo-seismic applications or in fiber optical gyroscopes.

These and other objects have been solved by the disclosure as defined in the claims and as described herein below.

It has been found that the disclosure and embodiments thereof have a number of additional advantages, which will be clear to the skilled person from the following description.

The laser device of the disclosure comprises a tunable laser that generates laser light and a laser control module configured to receive at least a portion of the laser light, to generate a control signal and to feed the control signal back to the laser for stabilizing the frequency, wherein the laser control module comprises a tunable frequency discriminating element which is preferably continuously frequency tunable, and where the laser control module is placed outside the laser cavity. In use, the control module generates a control signal to feed back to the laser in order to stabilize the frequency of the laser and in this manner improve the frequency stability of the laser light compared to its stability without the feedback control signal. Thereby the laser device of the disclosure is a frequency stable laser device.

Methods of stabilizing a laser using a feedback signal are well known and the laser device of the disclosure may be configured to perform the stability regulation using the generated control signal by any method, such as the method generally known from PID controller systems.

According to an embodiment of the disclosure, the objects above are fulfilled by providing a device, comprising a laser that generates laser light and a laser control module that receives at least a portion of the laser light and generates a control signal to feed back to the laser in order to stabilize the frequency of the laser and in this manner improve the frequency stability of the laser light, wherein the laser control module comprises a frequency discriminating element which is frequency tunable, and where the laser control module is placed outside the laser cavity. In an embodiment, the frequency discriminating element is continuously frequency tunable. In an embodiment, the frequency discriminating element is stepwise frequency tunable.

In a preferred embodiment, the tunable laser is a fiber laser, preferably a fiber DFB laser. The fiber laser, particularly single longitudinal mode and single frequency fiber Bragg grating based fiber lasers, such as DFB (distributed feedback) or DBR (distributed Bragg reflector) fiber lasers, constitute a class of compact laser devices which exhibits lower levels of frequency noise compared to many other types of similarly compact lasers. When used according to the disclosure, i.e. when locking the frequency of the laser to the frequency of a laser control module (that constitutes a stable frequency reference), very low levels of frequency noise can be obtained across a wide range of frequencies for example suitable for application in one or more interferometric sensor applications.

In an embodiment, the tunable laser is a diode laser, such as a semiconductor diode laser or an external cavity diode laser (also known as an extended cavity type semiconductor diode laser). Notice that in the latter case the tunable laser according to the disclosure has at least one frequency selective element inside the laser cavity (as described in e.g. prior art US2004/0101016 A1) and another frequency selective element in the laser control module outside the laser cavity. In yet an embodiment the tunable laser is a solid-state laser such as e.g. a compact diode pumped solid-state laser, such as e.g. a compact diode pumped non-planar ring oscillator type solid-state laser. The laser device can advantageously comprises two or more lasers of same of different type, e.g. combinations of the above embodiments.

In a preferred embodiment, the laser control module is encapsulated in a housing preferably to reduce impact of ambient temperature variations. The housing may comprise thermal insulation.

In a preferred embodiment, the laser control module is encapsulated in a hermetically sealed housing, such that the components inside the hermetic seal are shielded from ambient perturbations from vibration, acoustics, and/or humidity and/or variation of temperature and/or air pressure.

According to an embodiment of the disclosure, continuous tunability of the frequency discriminating element is fulfilled by providing a temperature sensitive discriminator which is monitored by a temperature sensor and controlled by a thermo-electric device. Especially, improved stability is fulfilled by positioning the temperature sensor in physical contact or close proximity to the temperature dependent frequency discriminating element and further by isolating the temperature dependent frequency discriminating element from thermal variations caused by thermal radiation, thermal convection or thermal guiding. The temperature sensor could be any of but not limited to the following components: Negative Temperature Coefficient (NTC) thermistor, Positive Temperature Coefficient (PTC) thermistor, Resistance Temperature Detector (RTD) or thermocouple. The thermo-electric element could be any of but not limited to the following components: Peltier element, thin film heating element or other resistive heating elements. According to an embodiment of the disclosure, the thermo-electric element could be located inside or outside a hermetically sealed housing together with the other components of the laser control module.

According to an embodiment of the disclosure, continuous tunability of the frequency discriminating element is fulfilled by providing a discriminator which is sensitive to changes in the dimensions of the discriminator. In a preferred embodiment, a frequency discriminating element, which is sensitive to changes in the dimensions, could be a Fabry-Perot interferometer, where the distance between the mirrors is controlled by an actuator, which could be a piezo electric actuator, a magnetostrictive actuator or a thermal expansion actuator.

According to an embodiment of the disclosure, continuous tunability of the frequency discriminating element is fulfilled by providing a discriminator which is sensitive to the angle between the laser light beam and the discriminator. In a preferred embodiment, a frequency discriminating element, which is sensitive to changes in the angle between the laser light beam and the discriminator, could be a Fabry-Perot interferometer, where the angle between the laser light beam and the interferometer is controlled by an actuator, which could be a piezo electric actuator, a magnetostrictive actuator or a thermal expansion actuator.

According to an embodiment of the disclosure, the frequency discriminating element is an interferometer, and in a preferred embodiment, the interferometer is a Fabry-Perot interferometer. The Fabry-Perot interferometer has the particular advantage with respect to the disclosure that a combination of high finesse and a suitable free spectral range can be obtained using a small interferometer that easily fits into a compact hermetically sealed laser control module (e.g. as in FIG. 1) as described above. In the prior art extremely low noise laser systems have been enabled using stabilized high finesse interferometers ([Tröbs et al], [Gréverie et al]), but these are typically large and bulky and are as such unsuited for use in a compact laser product aimed for industrial applications. In a preferred embodiment the interferometer finesse is higher than 10, preferably higher than 40, or even higher than 100. In a preferred embodiment, the interferometer Free Spectral Range is within the range 1 GHz-200 GHz, preferably within the range 10 GHz-50 GHz. The combination of a relatively high finesse (e.g. around 50) and a suitable Free Spectral Range (e.g. 25 GHz) secures a steep slope (measured e.g. in dB/GHz) in the interferometer transmission function. This steep slope secures that small excursions of the laser frequency result in a measurable current from the photo detectors (see FIG. 2, points 4 and 5) with a suitably high signal/noise ratio in the control signal that feeds back to the laser (see FIG. 3). The choice of Free Spectral Range enables a small size of the Fabry-Perot interferometer. As an example, a Free Spectral Range of 25 GHz corresponds to an interferometer length of approximately 6 mm for an air spaced interferometer (mirrors spaced 6 mm apart with air in between), and approximately 4.1 mm for a solid silica interferometer. This size makes it possible to fit the interferometer into a compact laser control module as described above and as depicted in FIGS. 1 and 2. The choice of finesse of e.g. 50 represents a compromise between the need for a steep slope in the interferometer transmission function and what is easily feasible. First of all the interferometer mirrors need to have a high reflectivity and secondly integrating the interferometer in a compact laser control module requires accurate alignment of the optical fiber with respect to the interferometer optical axis to maintain the maximum possible finesse.

In an embodiment of the disclosure, the device comprises the use of Mach-Zender interferometers, ring resonator interferometers, and Michelson interferometers. These interferometers hold the advantage that they can be fabricated using waveguide technology. On the other hand, e.g. the Mach-Zender interferometer would require a long path length imbalance to obtain a suitably steep frequency response for frequency noise reduction through locking. This again leads to larger size interferometers, which are less suited for integration with compact laser devices.

According to an embodiment of the disclosure, the frequency discriminating element is temperature tunable. Some applications for low noise laser devices according to the disclosure require that the frequency be locked to obtain a low level of frequency noise while still being able to tune the center frequency of the locked laser. This can be required e.g. when using a laser device according to the disclosure for interrogation of complex systems of multiple interferometers e.g. in geo-seismic sensing systems, where the individual sensor interferometers are frequency separated. In the prior art ([Tröbs et al], [Gréverie et al]), locking to high finesse interferometers to reduce the laser frequency noise is typically obtained using interferometers built from materials with low thermal expansion coefficients. Furthermore, these interferometers will typically be air spaced. E.g. a Fabry-Perot interferometer used for this purpose will consist of two high reflectivity mirrors spaced by a low thermal expansion material, where the spacer is hollow, consisting e.g. of a tube, 3 rods to hold the mirrors or similar structures. When further employing active thermal stabilization to the interferometer, such an interferometer holds the very significant advantage that its frequency response (i.e. the sensitivity of the position of the peaks (or the steep slope) in its transmission function) can be very low. This again means that a laser locked to such an interferometer can be expected to exhibit low frequency noise also at low frequencies (e.g. sub-Hz-100 Hz) corresponding to typical thermal fluctuations in the environment. Such air spaced low thermal expansion interferometers are typically also employed in low finesse wavelength lockers for telecom applications, where the purpose is not to reduce the laser frequency noise, but rather to maintain the laser frequency within a typical filter bandwidth e.g. in a dense wavelength division multiplexed optical communication system. Such telecom grade wavelength lockers are un-suited for the purpose of laser frequency noise reduction due to their low finesse (typically 2-4), and further they cannot be tuned in wavelength or frequency. The prior art describes a frequency tunable telecom grade wavelength locker ([Tuominen et al]). However, this wavelength locker again has a very low finesse and is hence unsuited for laser frequency noise reduction. It is generally acknowledged in the field that low thermal expansion materials must be used in interferometers used for the purpose of laser frequency noise reduction through frequency locking for the reasons described here. Low thermal expansion interferometers on the other hand do not allow continuous frequency tuning of the device. In order to allow continuous frequency tuning of the device the interferometer length must be continuously tunable. This can be accomplished by various means, e.g. by inserting a piezo electric element or a magnetostrictive element or other actuator between the interferometer mirrors (if a Fabry-Perot interferometer is used), or by means of changes in the angle of the interferometer with respect to the optical axis of the system or by other means. In a preferred embodiment, the frequency discriminating element is temperature tunable. In a further preferred embodiment, the temperature-tuning coefficient is higher than 1 pm/K, preferably higher than 5 pm/K. In yet a preferred embodiment temperature tunability is obtained by fabricating the frequency discriminating element from solid silica. Silica holds the advantage that it is a highly optical transparent material that is easily machined to the right size and shape. It further has a thermal response of approximately 1.25 GHz/K rendering it suitable for thermal tuning.

When constructing a laser control module based on a typical telecom grade wavelength locker design but modified to use a solid silica etalon with high finesse a relatively high frequency sensitivity to ambient temperature variations must be expected compared to using an air spaced low thermal expansion interferometer. This translates into expecting a relatively high level of laser frequency noise at low frequencies. Surprisingly it turns out that by applying a thermal design of the wavelength locker, especially by careful attention to the position of the temperature sensor relative to the frequency discriminating element, the sensitivity of the locked laser device center frequency to ambient temperature variations can be reduced significantly to reduce correspondingly the laser device frequency noise at low frequencies. In a preferred embodiment, the temperature sensor is placed in direct contact with the frequency discriminating element. This will serve to reduce the impact on the center frequency of the frequency discriminating element originating from possible gradients between the wavelength locker case temperature and the temperature of the frequency discriminating element. If the temperature sensor is not placed close to or in direct contact with the frequency discriminating element, ambient temperature variations may lead to false temperature readings which again lead to false temperature adjustments of the frequency discriminating element which finally lead to an increase in frequency noise (typically at low frequencies).

In a preferred embodiment of the disclosure, the power of the portion of the laser light directed to the laser control module is monitored before entering the frequency discriminating element (FIG. 2, points 1 and 2), thus generating a reference signal (FIG. 2, point 4), and the control signal is constituted by the difference between the reference signal and the power transmitted through the frequency discriminating element (FIG. 2, point 5). Subtracting the reference signal secures that variations in laser power are not interpreted as laser device frequency excursions; such power variations would otherwise lead to a false signal from the laser control module leading to a corresponding increase in frequency noise.

In a preferred embodiment of the disclosure, the frequency discriminating element is a silica based Fabry-Perot interferometer and the power is detected using photo detectors. Typical examples of suitable photo detectors include, but are not limited to, InGaAs pin detectors, which have a high responsivity at 1550 nm (typically around 1 Ampere/Watt), are sufficiently small that they fit easily into a compact wavelength locker type laser control module, and have a bandwidth that far exceeds the requirements.

In a preferred embodiment of the disclosure, the photo detectors are serially connected so that the anode of one photo detector is connected to the cathode of the other, and the control signal is taken from the common terminal of the two photo detectors (FIG. 2, point 5). By serially coupling the photo detectors this way the signal is automatically generated as the difference between the photo current generated from the light transmitted through the frequency discriminating element and the photo current generated from the reference light. This reduces noise and hence improves the signal/noise ratio of the control signal that feeds back to the laser for frequency stabilization.

In a preferred embodiment of the disclosure, the detected difference signal between the frequency discriminating element and the reference can be offset by an external control signal and thus enabling faster frequency tuning of the laser light than obtainable by tuning the frequency discriminating element while simultaneously improving the frequency stability of the laser light. Using this external control signal enables tuning of the laser frequency at a speed that is limited by the lasers tuning mechanisms, whereas the frequency tuning range is limited by the spectral width of the frequency discriminating elements locking slope.

In a preferred embodiment of the disclosure, an independent power measurement of the reference signal is fulfilled by providing a current mirror to copy the current through the reference photo detector without affecting the measurement of the difference signal between the reference signal and the frequency discriminating element signal. This enables using the reference photo detector to provide feedback for reducing the laser light intensity noise without the requirement of adding further optical components and thus reduce the system complexity and the requirement on the laser power for optimum noise reduction.

An embodiment comprises a system with multiple wavelength-separated lasers, each laser comprising a device according to the disclosure. Such a system can be used e.g. to interrogate complex sensor systems based on wavelength separated sensor elements (e.g. fiber interferometers). In an embodiment, the light generated from the multiple lasers is multiplexed into one single optical fiber, preferably using a fiber coupled arrayed waveguide grating (AWG) or other fiber coupled devices for wavelength multiplexing. By multiplexing the wavelength separated laser signals, the combined laser interrogation signal can be directed in an efficient manner to a multiple of fiber based wavelength separated sensor elements. In one embodiment, the laser devices or multiple wavelength laser systems according to the disclosure can be used in interferometric sensing applications, such as geo-seismic applications, in fiber optical gyroscopes, or in coherent LIDAR/vibrometer applications.

It should be emphasized that the term "comprises/comprising" when used herein is to be interpreted as an open term, i.e. it should be taken to specify the presence of specifically stated feature(s), such as element(s), unit(s), integer(s), step(s) component(s) and combination(s) thereof, but does not preclude the presence or addition of one or more other stated features.

All features of the disclosure including ranges and preferred ranges can be combined in various ways within the scope of the disclosure, unless there are specific reasons for not to combine such features.

BRIEF DESCRIPTION OF DRAWINGS

The invention will be explained more fully below in connection with preferred embodiments and with reference to the drawings in which:

FIG. 5 shows an external cavity diode laser from prior art, as e.g. shown in FIG. 2 of ([US2004/0101016 A1]).

FIG. 6 illustrates the use of the tunable etalon inside the external cavity diode laser shown in FIG. 5.

DETAILED DESCRIPTION

Figure 1:
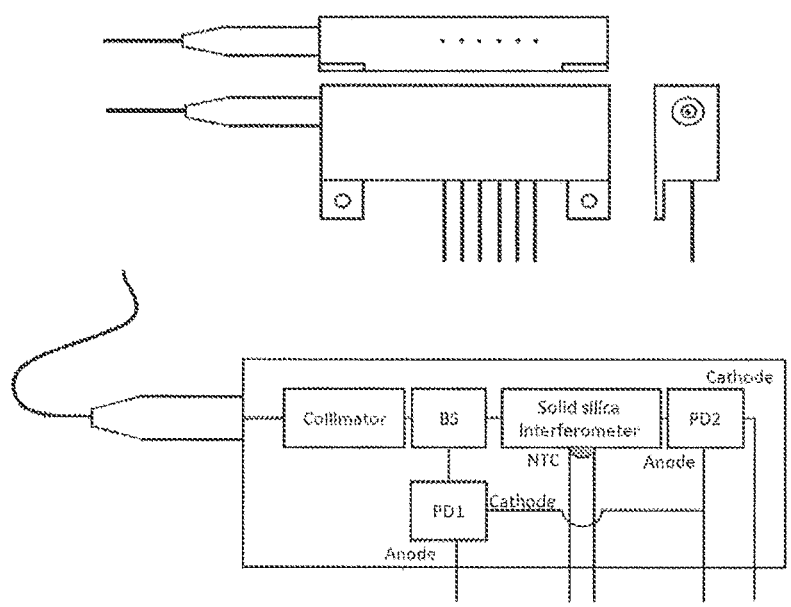
FIG. 1 is a schematic sketch of a compact high finesse wavelength locker.

FIG. 1 shows the design and the function of a wavelength locker as described in the text, particularly in example 1. The top part of FIG. 1 shows the outline of a fiber coupled wavelength locker approximately 40 mm×15 mm×8.5 mm. The bottom part of FIG. 1 illustrates the functionality of the wavelength locker: light from the optical fiber is divided by a beam splitter (BS) into one part that acts as a reference signal (detected by photo detector PD1) and another part that is passed through a frequency discriminating element, here specifically a solid silica etalon (detected by photo detector PD2). The two photo detectors are serially connected such that the anode of PD2 is coupled to the cathode of PD1—creating a balanced detection scheme.

Figure 2:
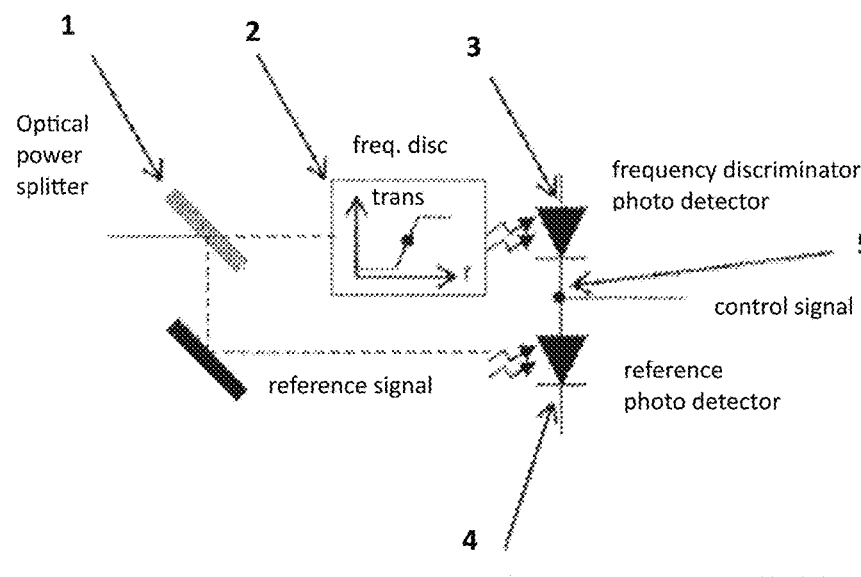
FIG. 2 is a schematic sketch of a preferred embodiment of high finesse wavelength locker with frequency discriminator and photo detectors arranged for balanced detection.

FIG. 2 also shows the functionality of a generic wavelength locker illustrating the frequency selective nature of the frequency discriminating element.

Figure 3:
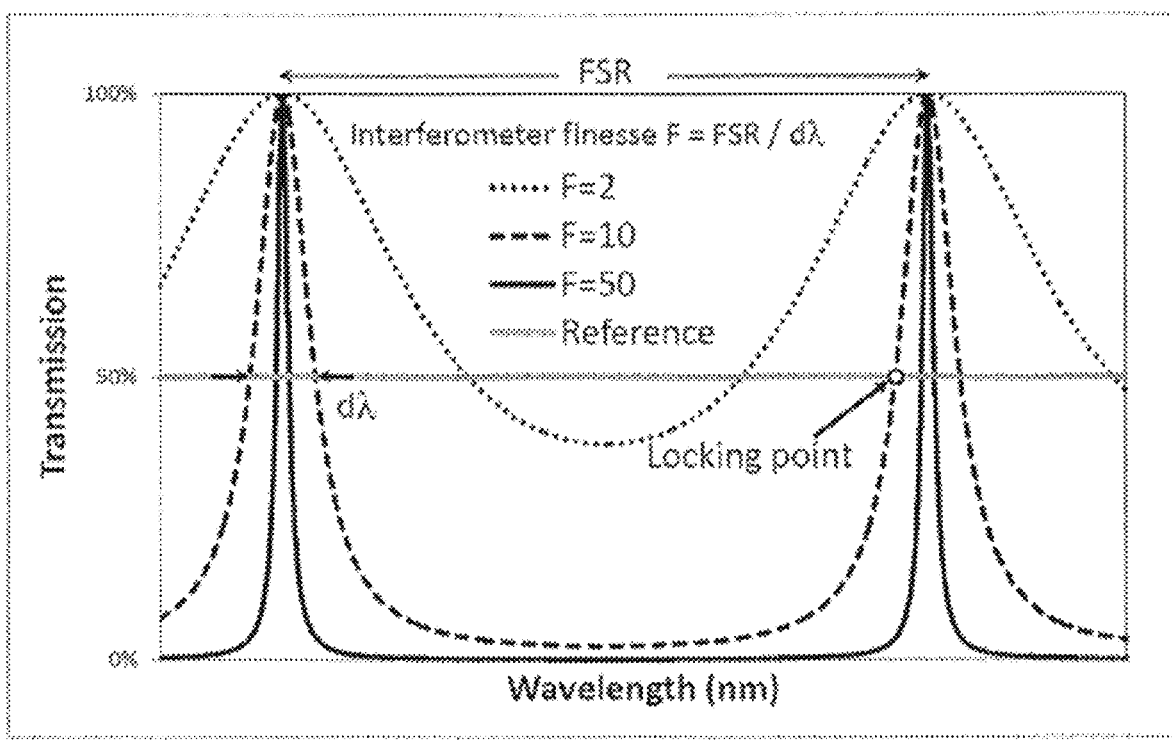
FIG. 3 shows interferometer transfer functions with a possible locking point.

FIG. 3 shows the transmission function of interferometers with different values of the finesse as well as an indication of a typical position of the locking point. The locking point, however, does not need to be at the 50% mark. The locking point can be adjusted by measuring the amplified signal from the balanced detection against an offset voltage value.

Figure 4:
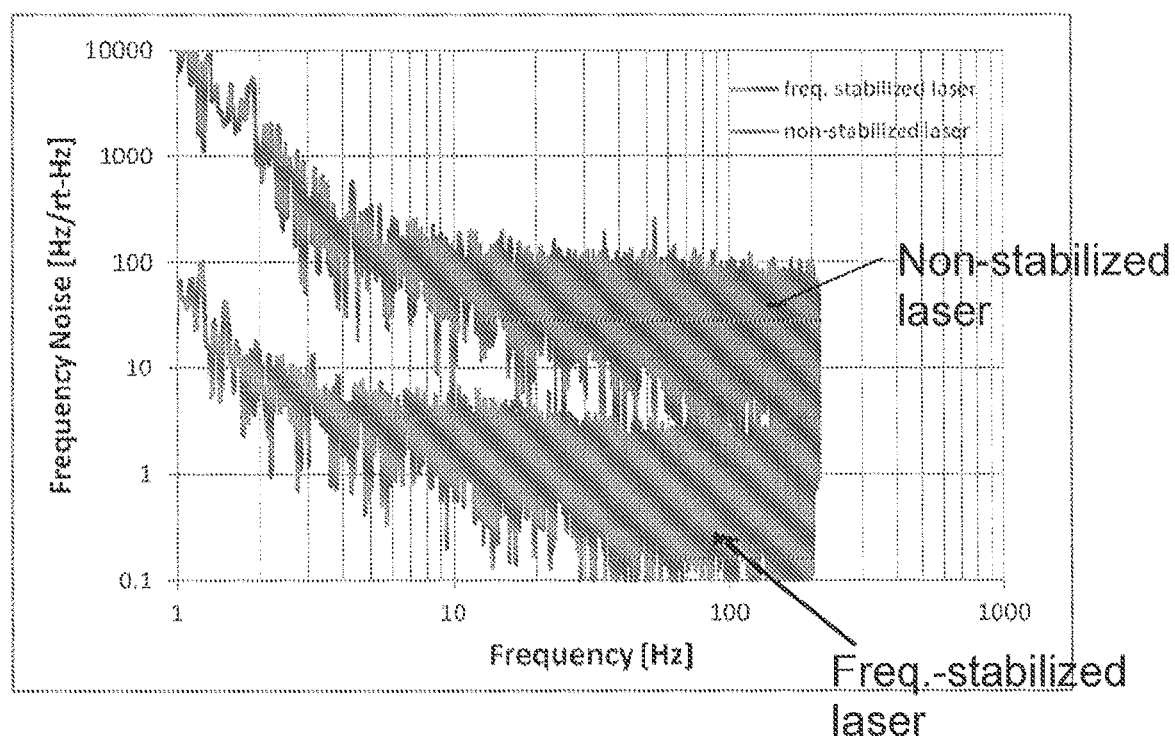
FIG. 4 shows frequency noise of a fiber DFB laser with (freq. stabilized laser) and without (non-stabilized laser) the improvements by using a laser control module outside the laser cavity according to the disclosure.

FIG. 4 illustrates how the devices and techniques of the disclosure can be used to improve the frequency noise of a tunable fiber DFB laser.

FIG. 5 shows an external cavity diode laser from prior art 500, as e.g. shown in FIG. 2 of US2004/0101016 A1. The laser cavity comprises a high reflectivity mirror 501, a tunable etalon (502), a lens (503), and a diode laser 503. The back side of the diode laser act as an output coupler and the laser output is thereby going through laser diode (504).

Figure 7:
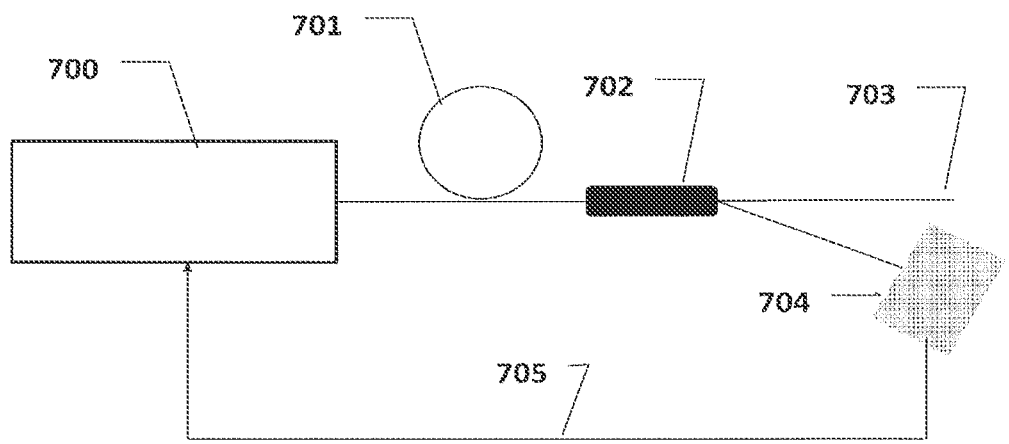
FIG. 7 shows a laser device according to the disclosure. It comprises a tunable laser configured to generate laser light and a laser control module configured placed outside the laser cavity. The laser control module comprises an etalon with high finesse and the transmission through the etalon is fed back into the cavity to stabilize the laser frequency.

FIG. 6 illustrates the use of the tunable etalon inside the external cavity diode laser shown in FIG. 5. The laser gain band 601 overlaps with several cavity modes 602 and in the absence of an etalon the laser can lase on several cavity modes simultaneously. This is also referred to as that lasing at several longitudinal modes. However, the transmission spectrum of the etalon (603) has a narrow passband and thus acts as a mode selector so that the laser only lases at one laser cavity mode. The tunability of the etalon allows for fine-tuning of the laser frequency through adjustment of the laser cavity optical path length FIG. 7 shows a laser device according to the disclosure. It comprises a tunable laser with a single output mode 700. The output of the laser traverses an optical fiber 701 and an optical coupler or splitter 702. One of the output ports of the coupler is laser output 703. The other output is sent to a high finesse tunable etalon 704 and the transmission of the etalon 705 is sent back into the laser cavity to generate an error signal to stabilize the laser frequency.

Figure 8:
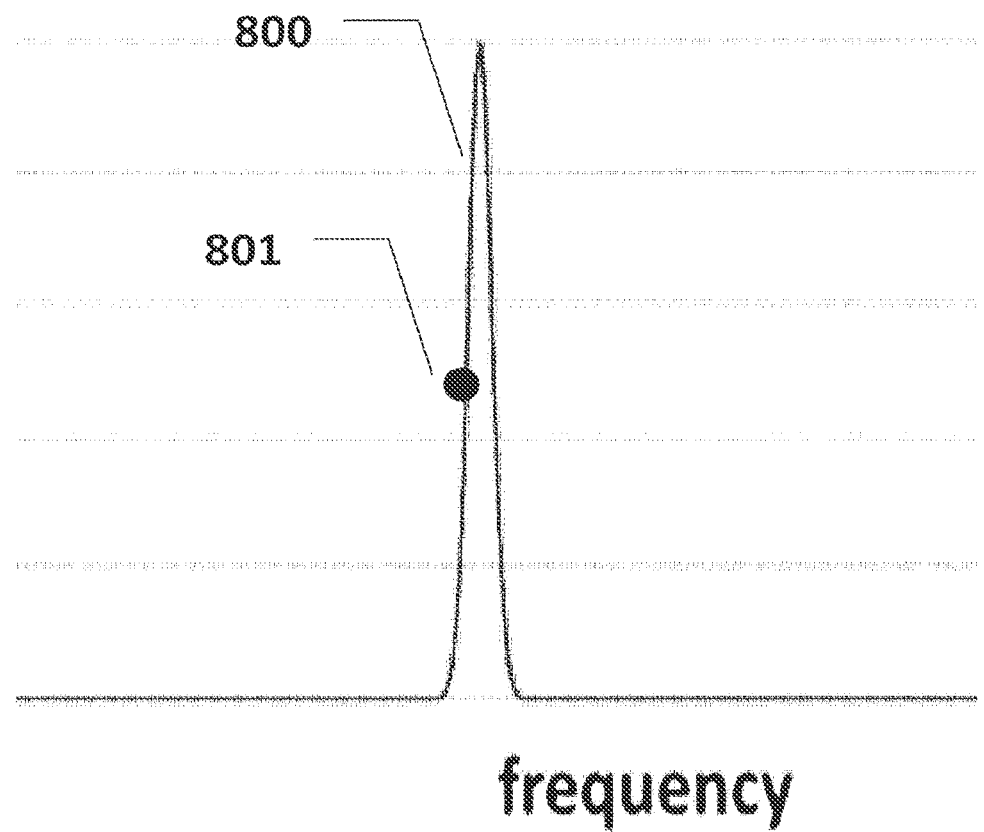
FIG. 8 illustrates the locking point on the etalon used in FIG. 7.

FIG. 8 illustrates the etalon transmission spectrum (800) and a suitable locking point 801 for the tunable laser 700 shown in FIG. 7. By designing the etalon with a high finesse and with a compact design, the etalon center frequency can be made more stable than that of the laser, so that frequency locking the laser to the etalon reduces the frequency noise of the laser.

Figure 9:
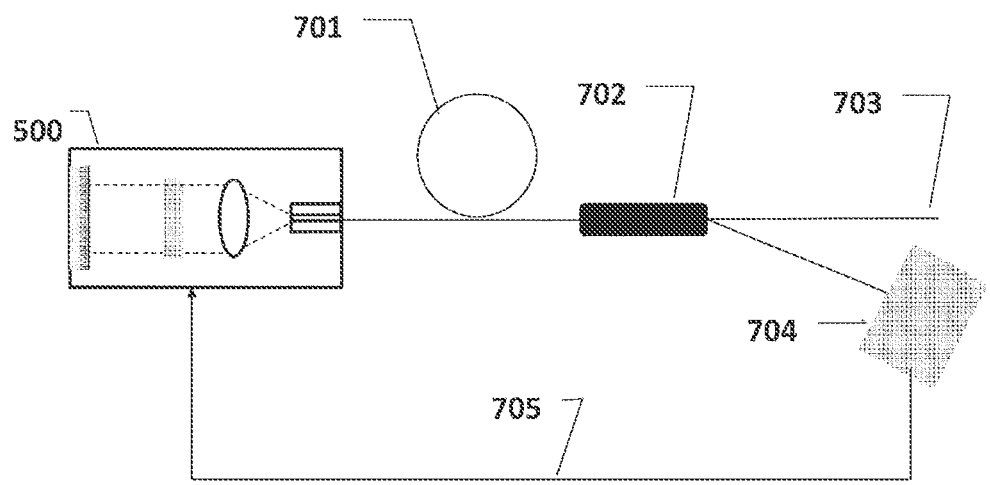
FIG. 9 shows a laser device according to the disclosure where the tunable laser is an external cavity diode laser as shown in FIG. 5. The figures are schematic and may be simplified for clarity. Throughout, the same reference numerals are used for identical or corresponding parts.

FIG. 9 shows a laser device according to the disclosure where the tunable laser 700 consists of an external cavity diode laser 500 as shown in FIG. 5.

EXAMPLE

An example of the embodiment of a device according to the disclosure was produced in the following way. A low noise distributed feedback fiber laser operating at 1542.5 nm and providing an output power of approximately 50 mW and a spectral linewidth of <1 kHz was fabricated according to standard production processes. A hermetically sealed custom designed wavelength locker with dimensions of approximately 40 mm×15 mm×8.5 mm was fabricated. The frequency discriminating element consisted of a solid silica Fabry-Perot interferometer with a free spectral range of 25 GHz and a finesse of approximately 50. The temperature sensor was fixed in direct contact with the interferometer. A portion of the light from the distributed feedback fiber laser is passed via optical fiber to the custom designed wavelength locker. Inside the wavelength locker, the light from the optical fiber was collimated and divided by a beam splitter into one part that acts as a reference signal detected by a reference photo detector and another part that is passed through the solid silica interferometer and detected by a signal photo detector. The two photo detectors were serially connected such that the anode of the signal photo detector was coupled to the cathode of the reference photo detector—creating a balanced detection scheme. The outline and the schematic of the wavelength locker are illustrated in FIGS. 1 and 2. The fiber laser and wavelength locker were packaged in the same mechanical enclosure (dimensions 23 mm×92 mm×200 mm) including thermal control of both fiber laser and wavelength locker and additional thermal shielding of the wavelength locker to reduce the impact of ambient thermal variations. The fiber laser frequency can be tuned using thermal and piezo control. By locking the fiber laser to one of the steep wavelength locker slopes (using feedback to both fiber laser temperature and piezo voltage), the frequency noise of the fiber laser could be reduced by more than two orders of magnitude over a broad frequency range—as illustrated in FIG. 4. Using an external modulation input it was possible to provide fast tuning of the laser without compromising the obtained improvement in frequency noise.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Some preferred embodiments have been shown in the foregoing, but it should be stressed that the invention is not limited to these, but may be embodied in other ways within the subject-matter defined in the following claims.

REFERENCES

R. van Leeuwen, L. S. Watkins, C. Ghosh, R. Gandham, S. R. Leffler, B. Xu, and Q. Wang., Princeton Optronics, 1 Electronics Drive, Mercerville, NJ 08619, "Low Noise High Power Solid State Laser for 1550 nm Wavelength Band", Proceedings of the 19th annual meeting of the IEEE Lasers and Electro-Optics Society (LEOS '06), p. 336 (2006).

Michael Tröbs, Luigi d'Arcio, Gerhard Heinzel, Karsten Danzmann, "Frequency stabilization and actuator characterization of an ytterbium-doped distributed-feedback fiber laser for LISA", J. Opt. Soc. Am. B, Vol. 26, No. 5, May 2009.

Jan Hald, Lars Nielsen, Jan C. Petersen, Poul Varming, Jens E. Pedersen, "Fiber laser optical frequency standard at 1.54 µm", Optics Express, Vol. 19, Issue 3, pp. 2052-2063 (2011).

Jesse Tuominen, Tapio Niemi, and Hanne Ludvigsen, "Wavelength reference for optical telecommunications based on a temperature-tunable silicon etalon", Rev. Sci. Instrum. 74, 3620 (2003).

Caroline Gréverie, Catherine N. Man, Alain Brillet, Jean Pierre Coulon, Jens Engholm Pedersen, "Stabilisation en Frequence d'un Laser Fibre par Controle du Courant de Pompe", JNOG 2008 Conference, Lannion, France, Ma2.3.

US2004/0101016 A1 (MACDONALD et al.) 20040527, "Hermetically sealed external cavity laser system and method".

WO 03/005502 A2 (New Focus Inc., Intel Corp.) 20030116, "External cavity Laser with selective thermal control".

The invention claimed is:

1. A laser device, comprising:
   a tunable fiber laser comprising a laser cavity; and
   a laser control module placed outside the laser cavity, wherein:
   the tunable fiber laser is configured to generate laser light having a center frequency,
   the laser control module is configured to receive at least a portion of the laser light generated by the tunable fiber laser, to generate a control signal and to feed the control signal back to the tunable fiber laser for stabilizing the center frequency of the laser light, and
   the laser control module comprises a frequency discriminating element comprising a solid-silica interferometer having an interferometer finesse of at least about 10.

2. The laser device of claim 1, wherein the laser control module comprises a temperature sensor.

3. The laser device of claim 2, wherein the temperature sensor is placed in direct contact with the frequency discriminating element.

4. The laser device of claim 1, wherein the laser control module comprises a thermo-electric element located for thermally tuning the frequency discriminating element.

5. The laser device of claim 1, wherein the frequency discriminating element is tuned by temperature alone.

6. The laser device of claim 1, wherein the frequency discriminating element is continuously frequency tunable.

7. The laser device of claim 1, wherein the interferometer is a Fabry-Perot interferometer.

8. The laser device of claim 1, wherein the interferometer consists of a solid silica Fabry-Perot interferometer.

9. The laser device of claim 1, wherein the interferometer is selected from a Mach-Zender interferometer, a ring resonator, and a Michelson interferometer.

10. The laser device of claim 1, wherein the interferometer has an interferometer finesse of at least about 40.

11. The laser device of claim 1, wherein the interferometer has an interferometer finesse of at least about 100.

12. The laser device of claim 1, wherein the interferometer has a Free Spectral Range of at least about 25 GHz.

13. The laser device of claim 1, wherein the interferometer is fabricated using waveguide technology.

14. The laser device of claim 1, wherein a temperature-tuning coefficient of the interferometer is higher than 1 pm/K.

15. The laser device of claim 1, wherein a temperature-tuning coefficient of the interferometer is higher than 5 pm/K.

16. The laser device of claim 1, wherein the tunable fiber laser is a single frequency laser.

17. The laser device of claim 1, wherein the laser device is configured to monitor the power of a portion of the laser light directed to the laser control module before entering the frequency discriminating element to generate a reference signal, and wherein the device is configured to generate the control signal by a difference between the reference signal and the power of the laser light transmitted through the frequency discriminating element.

18. The laser device of claim 1, wherein the laser control module, without the tunable fiber laser, is encapsulated inside a hermetically sealed housing, which isolates the tunable frequency discriminating element from thermal variations of the tunable laser.

* * * * *